(12) United States Patent
Hong et al.

(10) Patent No.: US 10,777,642 B2
(45) Date of Patent: Sep. 15, 2020

(54) FORMATION OF ENHANCED FACETED RAISED SOURCE/DRAIN EPI MATERIAL FOR TRANSISTOR DEVICES

(71) Applicant: GLOBALFOUNDRIES Inc., Grand Cayman (KY)

(72) Inventors: Wei Hong, Clifton Park, NY (US); George R. Mulfinger, Gansevoort, NY (US); Hui Zang, Guilderland, NY (US); Liu Jiang, Clifton Park, NY (US); Zhenyu Hu, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/262,105

(22) Filed: Jan. 30, 2019

(65) Prior Publication Data

US 2020/0243646 A1    Jul. 30, 2020

(51) Int. Cl.
*H01L 29/08* (2006.01)
*H01L 21/8234* (2006.01)
*H01L 29/66* (2006.01)
*H01L 29/78* (2006.01)
*H01L 21/28* (2006.01)

(52) U.S. Cl.
CPC .... *H01L 29/0847* (2013.01); *H01L 21/28132* (2013.01); *H01L 29/6656* (2013.01); *H01L 29/66568* (2013.01); *H01L 29/7848* (2013.01)

(58) Field of Classification Search
CPC ....... H01L 21/28132; H01L 21/823814; H01L 21/83864; H01L 29/41783; H01L 29/6653; H01L 29/6656; H01L 29/66575; H01L 29/7848
See application file for complete search history.

(56) References Cited

U.S. PATENT DOCUMENTS

| | | | |
|---|---|---|---|
| 9,793,294 B1 | 10/2017 | Thees et al. | |
| 9,806,170 B1 | 10/2017 | Mulfinger et al. | |
| 10,008,576 B2 | 6/2018 | Mulfinger et al. | |
| 2010/0090289 A1* | 4/2010 | Yang | H01L 29/045 257/369 |

(Continued)

OTHER PUBLICATIONS

Related U.S. Appl. No. 16/262,052 Office Action dated Jun. 25, 2020.

*Primary Examiner* — David C Spalla
(74) *Attorney, Agent, or Firm* — Amerson Law Firm, PLLC

(57) ABSTRACT

One illustrative method disclosed herein may include forming a first straight sidewall spacer adjacent a gate structure of a transistor, forming a second straight sidewall spacer on the first straight sidewall spacer and forming a recessed layer of sacrificial material adjacent the second straight sidewall spacer such that the recessed layer of sacrificial material covers an outer surface of a first vertical portion of the second straight sidewall spacer while exposing a second vertical portion of the second straight sidewall spacer. In this example, the method may also include removing the second vertical portion of the second straight sidewall spacer, removing the recessed layer of sacrificial material and forming an epi material such that an edge of the epi material engages the outer surface of the first vertical portion of the second straight sidewall spacer.

18 Claims, 10 Drawing Sheets

(56) References Cited

U.S. PATENT DOCUMENTS

| | | | |
|---|---|---|---|
| 2014/0054715 A1* | 2/2014 | Liu | ................. H01L 21/823814 |
| | | | 257/369 |
| 2015/0028399 A1 | 1/2015 | Xiong et al. | |
| 2016/0013313 A1 | 1/2016 | Cheng et al. | |
| 2017/0317213 A1 | 11/2017 | Park et al. | |
| 2018/0138280 A1* | 5/2018 | Li | ..................... H01L 29/66636 |
| 2019/0312117 A1 | 10/2019 | Qi et al. | |
| 2020/0020770 A1 | 1/2020 | Qi et al. | |

* cited by examiner

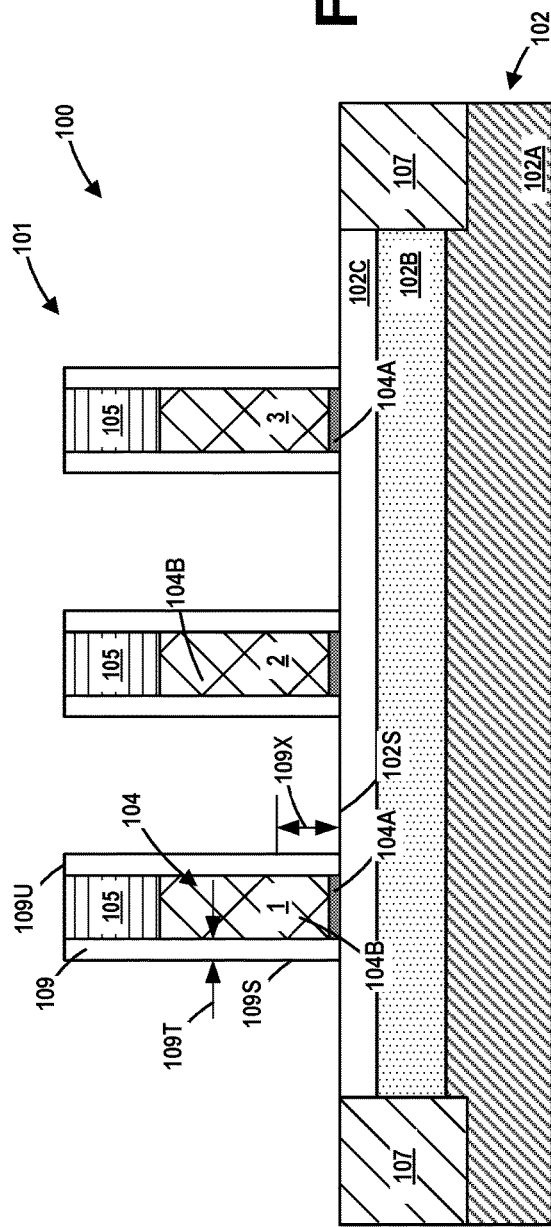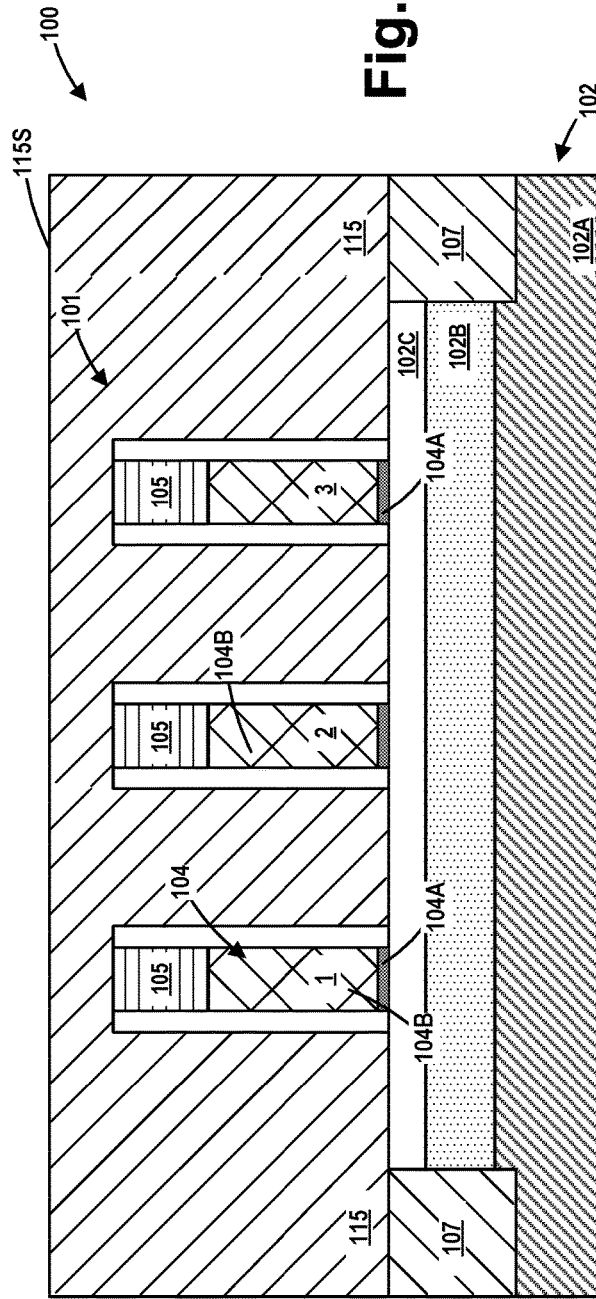

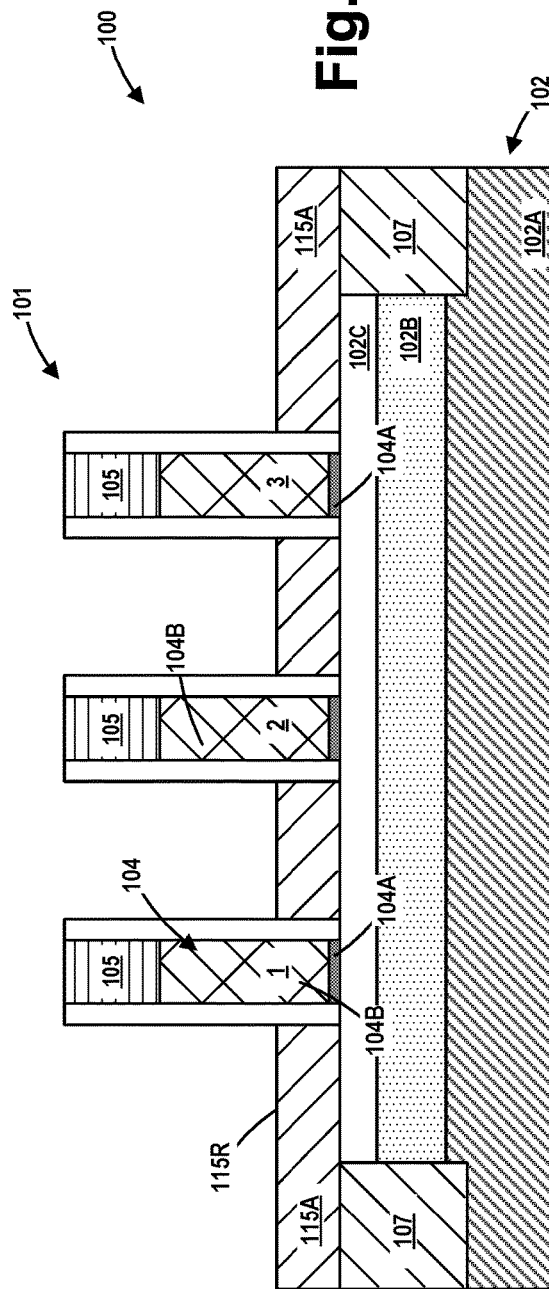
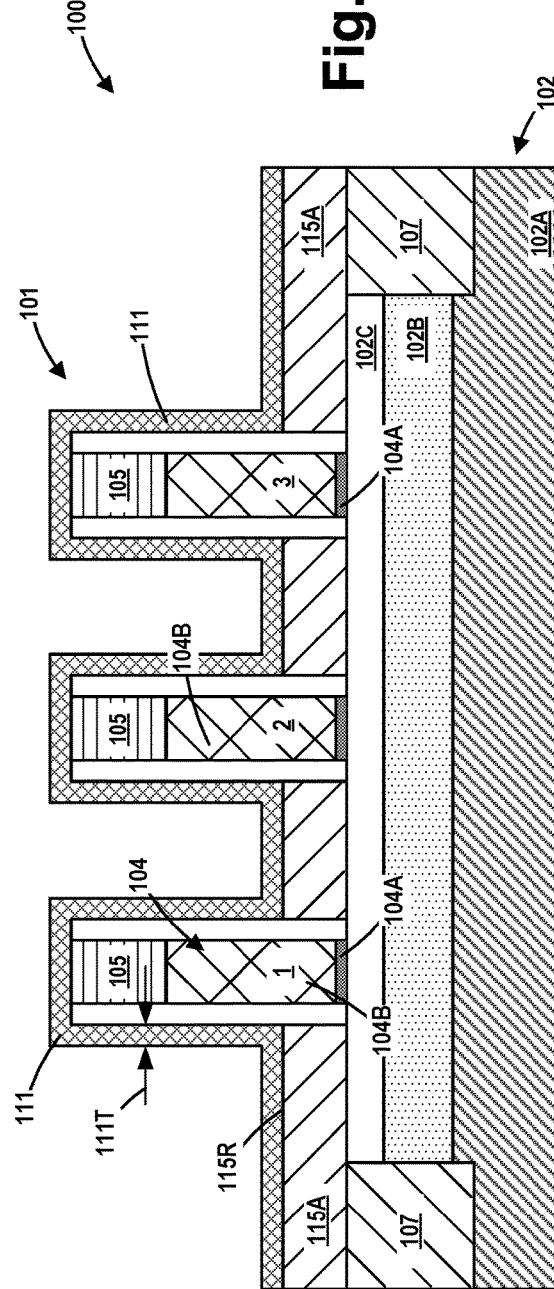

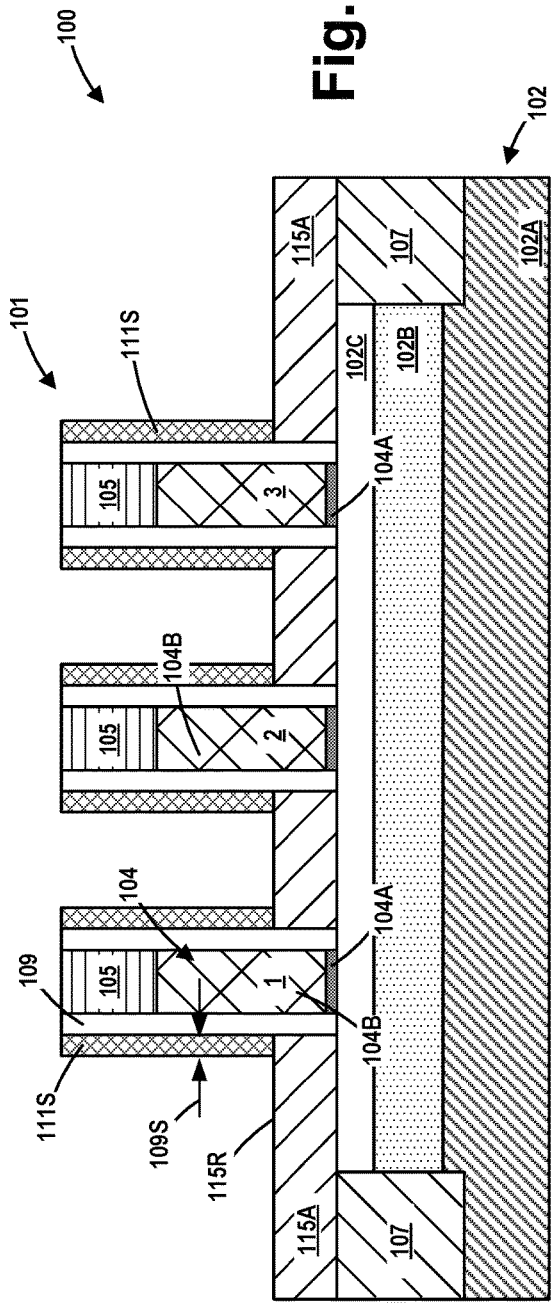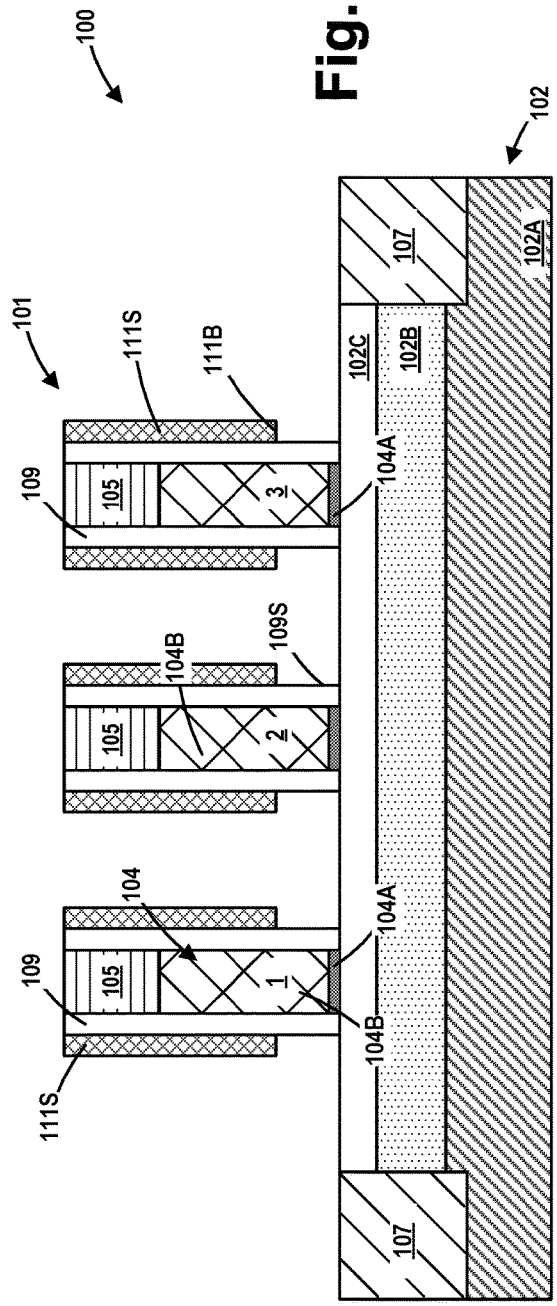

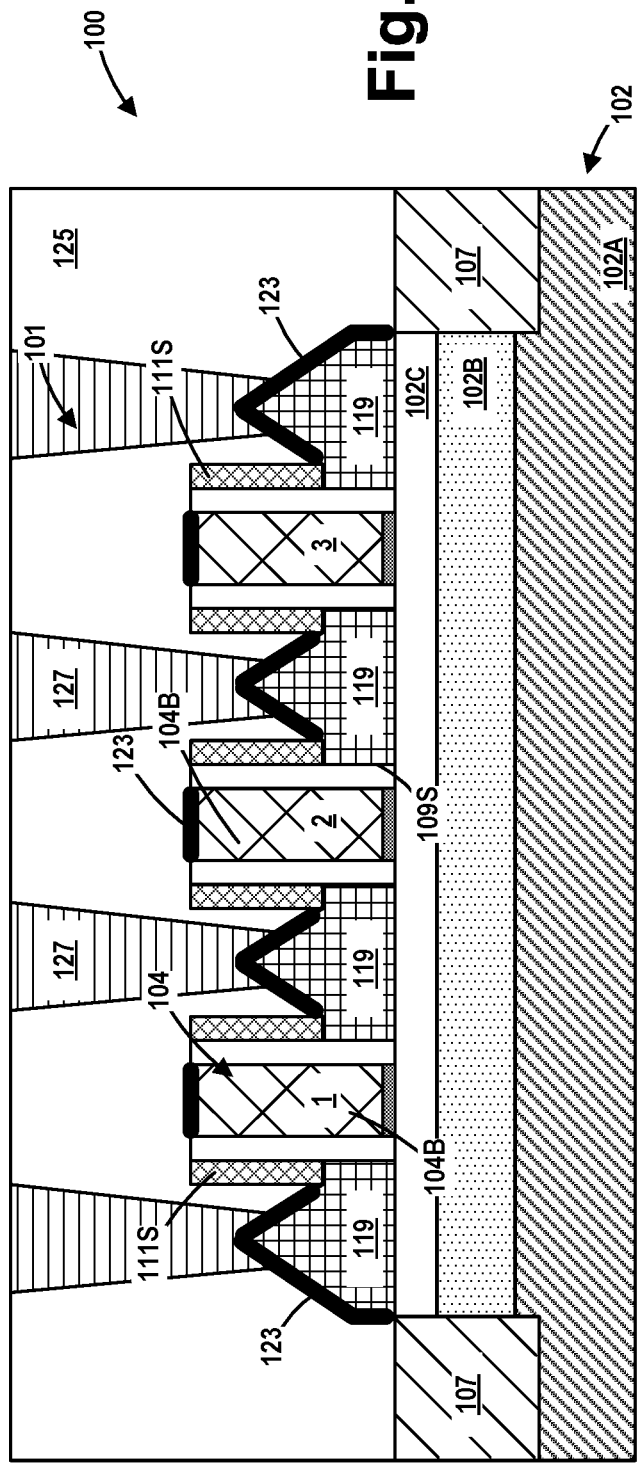

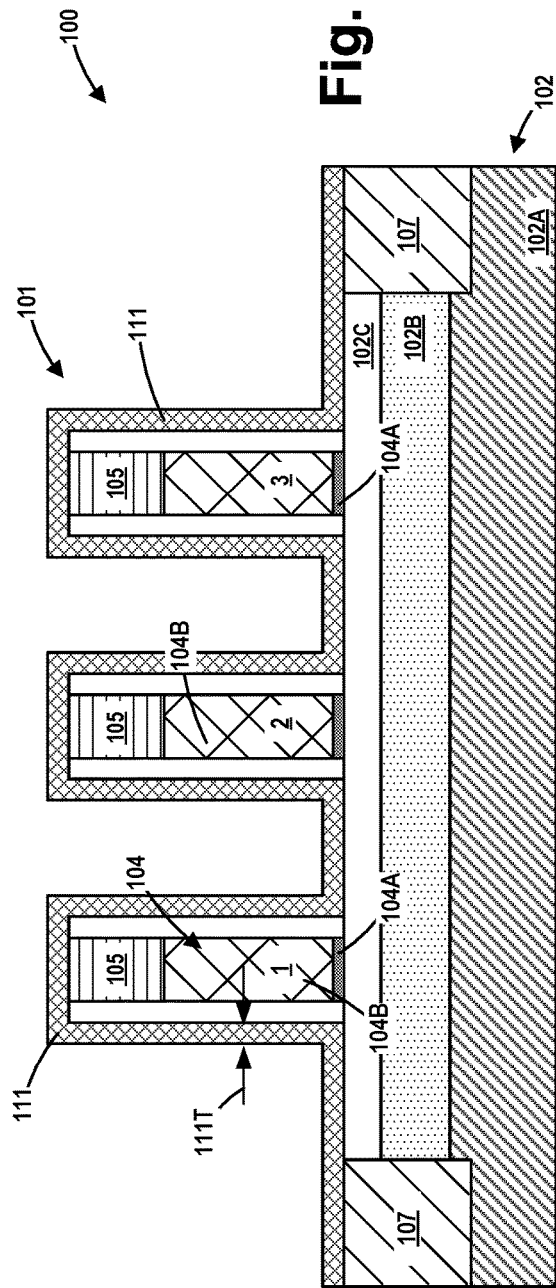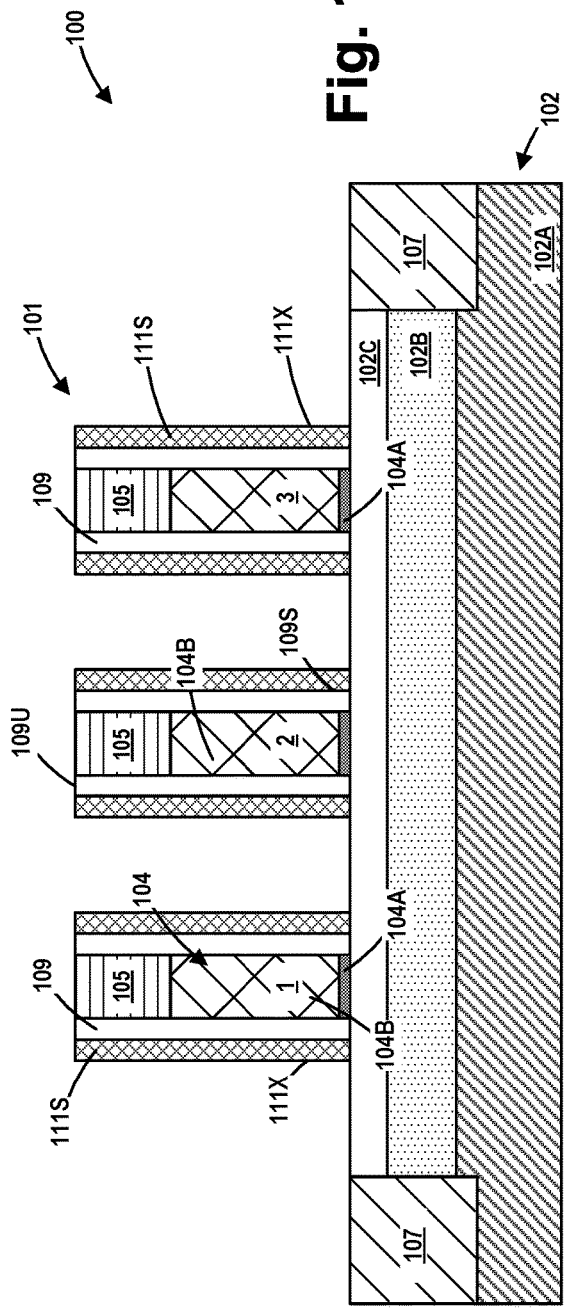

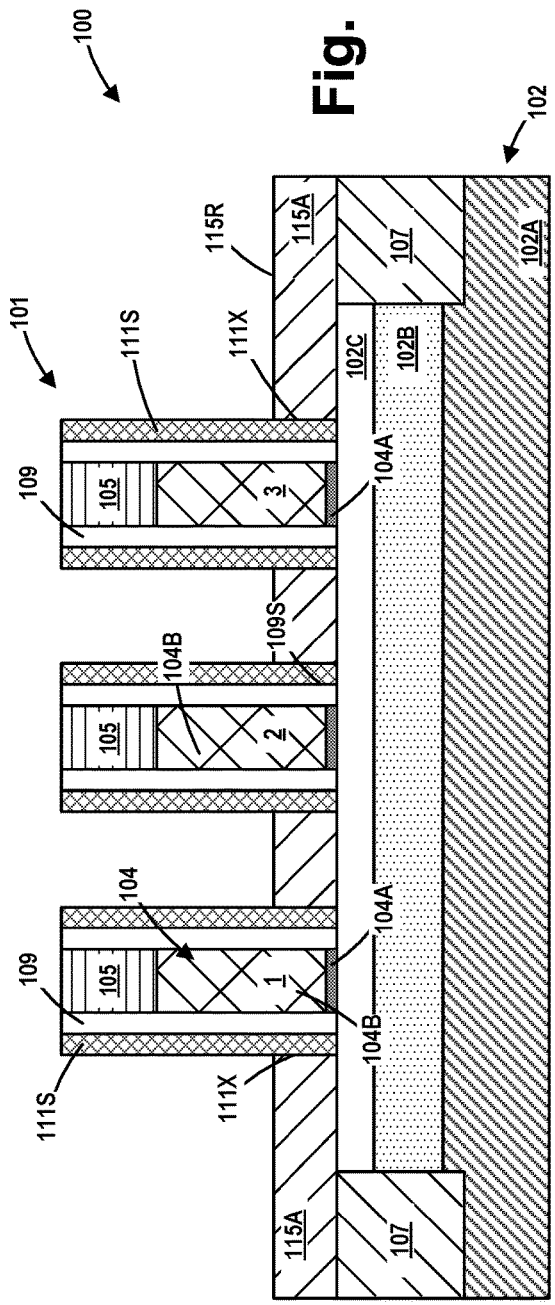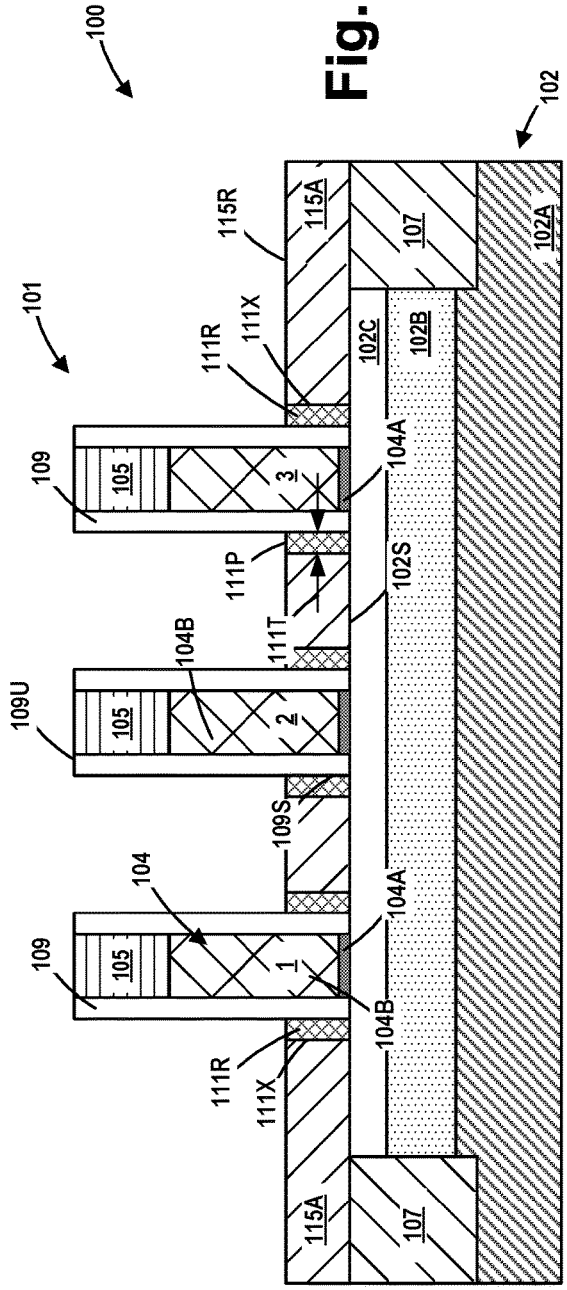

FORMATION OF ENHANCED FACETED RAISED SOURCE/DRAIN EPI MATERIAL FOR TRANSISTOR DEVICES

BACKGROUND

1. Field of the Disclosure

The present disclosure generally relates to the fabrication of semiconductor devices, and, more particularly, to various novel methods of forming enhanced faceted raised source/drain epi material for transistor devices and corresponding integrated circuit products.

2. Description of the Related Art

In modern integrated circuit products, such as microprocessors, storage devices, ASICs and the like, a very large number of circuit elements, especially transistors, are provided on a restricted chip area. The transistors come in a variety of shapes and forms, e.g., planar transistors, FinFET transistors, nanowire devices, fully-depleted devices (FD-SOI), etc. The transistors are typically either NFET or PFET type devices wherein the "N" and "P" designation is based upon the type of dopants used to create the source/drain regions of the devices. A transistor typically includes a conductive gate structure, a source region and a drain region.

Device designers are under constant pressure to increase the operating speed and electrical performance of transistors and integrated circuit products that employ such transistors. Given that the gate length (the distance between the source and drain regions) on modern transistor devices may be approximately 20-50 nm, and that further scaling is anticipated in the future, device designers have employed a variety of techniques in an effort to improve device performance, e.g., the use of high-k dielectrics, the use of channel stress engineering techniques on transistors (create a tensile stress in the channel region for NFET transistors and create a compressive stress in the channel region for PFET transistors), etc.

In many modern transistor devices, such as FDSOI devices, it is very common to form epitaxial (epi) semiconductor material in the source/drain regions of the transistor devices, i.e., to form raised source/drain regions. The formation of such epi semiconductor material can have several beneficial effects, e.g., it can reduce the resistance of the source/drain regions and it may be useful in imparting a desired stress condition, e.g., compressive or tensile, on the channel region of the transistor. Unfortunately, as device dimensions continue to shrink, e.g., as the gate pitch continues to decrease, the size or volume of the epi semiconductor material in the source/drain regions also tends to decrease. Such reduction in the volume of epi semiconductor material in the source/drain regions may lead to undesirable increases in the resistance of the source/drain regions and/or limit the effectiveness of the epi semiconductor material as it relates to imparting desired stress conditions on the channel region of the transistor device.

The present disclosure is directed to various novel methods of forming enhanced faceted raised source/drain epi material for transistor devices and corresponding integrated circuit products that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming enhanced faceted raised source/drain epi material for transistor devices and corresponding integrated circuit products. One illustrative method disclosed herein includes forming a first straight sidewall spacer adjacent a gate structure of a transistor, forming a second straight sidewall spacer on the outer surface of the first straight sidewall spacer and forming a recessed layer of sacrificial material adjacent the second straight sidewall spacer such that the recessed layer of sacrificial material covers an outer surface of a first vertical portion of the second straight sidewall spacer while exposing a second vertical portion of the second straight sidewall spacer. In this example, the method also includes removing the second vertical portion of the second straight sidewall spacer, removing the recessed layer of sacrificial material and forming an epi semiconductor material such that an edge of the epi semiconductor material engages the outer surface of the first vertical portion of the second straight sidewall spacer.

One illustrative transistor device disclosed herein includes a gate cap positioned above a gate structure of the transistor, a first straight sidewall spacer positioned on and in contact with a sidewall of the gate structure, the first sidewall spacer comprising a first upper surface, a second straight sidewall spacer positioned on and in contact with the first sidewall spacer, the second straight sidewall spacer comprising a second upper surface, wherein the second upper surface is at a level that is lower than the level of the first upper surface, and an epi semiconductor material that includes an edge that engages the outer surface of the second straight sidewall spacer.

BRIEF DESCRIPTION OF THE DRAWINGS

The disclosure may be understood by reference to the following description taken in conjunction with the accompanying drawings, in which like reference numerals identify like elements, and in which:

FIGS. 1-9 are drawings that depict one illustrative novel method disclosed herein for forming enhanced faceted raised source/drain epi material for transistor devices and corresponding integrated circuit products;

FIGS. 10-15 are drawings that depict yet another illustrative novel method disclosed herein for forming enhanced faceted raised source/drain epi material for transistor devices and corresponding integrated circuit products.

Figure 7:
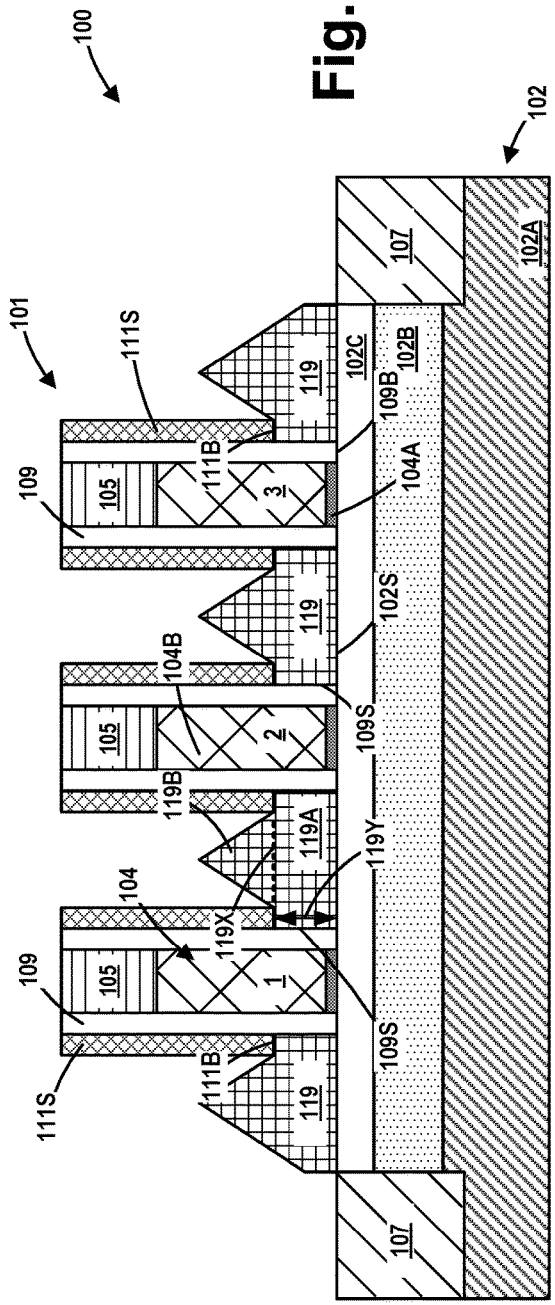

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods of forming enhanced faceted raised source/drain epi material for transistor devices and corresponding integrated circuit products. The methods and devices disclosed herein may be employed in manufacturing IC products using a variety of technologies, e.g., NMOS, PMOS, CMOS, etc., and they may be employed in manufacturing a variety of different products, e.g., memory products, logic products, ASICs, fully depleted devices (FDSOI), etc. As will be appreciated by those skilled in the art after a complete reading of the present application, the methods and devices disclosed herein may be employed in forming integrated circuit products using transistor devices in a variety of different configurations, e.g., planar devices, FinFET devices, etc. The gate structures of the transistor devices may be formed using either "gate first" or "replacement gate" manufacturing techniques. Thus, the presently disclosed subject matter should not be considered to be limited to any particular form of transistors or the manner in which the gate structures of the transistor devices are formed. In the examples depicted in the drawings, the transistor devices 101 will be planar transistor devices wherein the gate structure 104 of the devices 101 was formed using known gate first manufacturing techniques. Of course, the inventions disclosed herein should not be considered to be limited to the illustrative examples depicted and described herein. With reference to the attached figures, various illustrative embodiments of the methods and devices disclosed herein will now be described in more detail.

FIGS. 1-9 depict one illustrative novel method disclosed herein for forming enhanced faceted raised source/drain epi material for transistor devices 101 and corresponding integrated circuit products 100. The cross-sectional drawings included herein are taken through a plurality of transistor devices 101 formed in and above a semiconductor-on-insulator (SOI) substrate 102. The cross-sectional views are taken through the transistor devices 101 in a direction corresponding to the gate-length (GL) direction, i.e., the current transport direction, of the transistor devices 101. The transistor devices 101 disclosed herein may be of any type, form, shape or configuration, e.g., planar transistor devices, FinFET devices, etc. In the case where the transistor devices 101 are FinFET devices, the cross-sectional views depicted herein should be understood to be views taken through the long axis of a fin of such a FinFET transistor device. It should be noted that the drawings depicted herein are not to scale. Additionally, various doped regions, e.g., halo implant regions, well regions and the like, are not depicted in the attached drawings.

The product 100 will be formed on an illustrative SOI (semiconductor-on-insulator) structure or substrate 102. In general, the SOI substrate 102 is comprised of a base semiconductor substrate 102A, a buried insulation layer 102B (sometime referred to as a "BOX" layer when the buried insulation layer comprises silicon dioxide) positioned on the base substrate 102A and an active layer 102C positioned on the buried insulation layer 102B. Traditionally, and in one illustrative embodiment, the base semiconductor substrate 102A may comprise silicon, the buried insulation layer 102B may comprise silicon dioxide and the active layer 102C may comprise silicon. Of course, the base semiconductor substrate 102A and the active layer 102C may be made of any of a variety of different semiconductor materials, and the materials for the base semiconducting substrate 102A and the active layer 102C need not be made of the same semiconductor material in all applications, but such a situation may occur in some applications. Similarly, the buried insulation layer 102B may be comprised of a variety of different insulating materials. The thickness of the layers of the SOI substrate 102 may vary depending upon the particular application. Of course, the relative thicknesses of the active layer 102C, the buried insulation layer 102B and the base substrate 102A shown in the drawings are not to scale. The manner in which such SOI substrates 102 are manufactured are well known to those skilled in the art. Thus, the terms "substrate" or "semiconductor substrate" should be understood to cover all semiconducting materials and all forms of such materials.

In the depicted example, three illustrative transistors 101 (the gate structures 104 being labeled 1-3 for ease of reference) will be formed on the substrate 102. As noted above, the gate structures 104 for the transistor devices 101 will be depicted as being formed by performing known gate first manufacturing techniques.

FIG. 1 depicts the IC product 100 after several process operations were performed. First, isolation regions 107 were formed in the substrate 102 to define an isolated active region in the active layer 102C of the substrate 102. The isolation regions 107 may be formed by forming trenches that extend into the base substrate 102A of the substrate 102 and thereafter filling the trenches with an insulating material, e.g., silicon dioxide, using known manufacturing techniques.

Still referencing FIG. 1, a plurality of gate structures 104, with a gate cap 105 formed thereabove, were formed across the substrate 102. In one illustrative and non-limiting process flow, each of the gate structures 104 comprises a gate insulation layer 104A (e.g., silicon dioxide) and a conductive gate electrode material 104B (e.g., polysilicon or amorphous silicon). A gate cap 105 (e.g., silicon nitride) is positioned above each of the gate structures 104. In one illustrative process flow, the gate structures 104 (with the gate cap 105 thereabove) are initially formed as continuous line-type structures that extend across substantially the entire substrate 102. The long continuous line-type gate structure 104/gate cap 105 structures may be formed by depositing the materials for the gate structures 104 as well as a layer of material for the gate caps 105 across the entire substrate 102, forming a patterned gate etch mask (not shown) above the deposited layer of the material for the gate caps 105, and performing one or more etching processes through the patterned gate etch mask to remove the exposed portions of gate cap material and, thereafter, the exposed portions of the materials of the gate structure.

Also depicted in FIG. 1 is a first straight sidewall spacer 109, with an upper surface 109U, that was formed on the sidewalls of the gate structures 104 and the gate caps 105. The first straight sidewall spacer 109 may be formed by depositing a conformal layer of first spacer material across the substrate 102 and on the sidewall of the gate structure 104 and thereafter performing an anisotropic etching process on the layer of first spacer material to remove substantially all of the horizontally-oriented portions of the layer of first spacer material. As used herein and in the claims, the term "straight sidewall spacer" shall be understood to mean a spacer formed by the method described for the formation of the first straight sidewall spacer 109, i.e., conformal deposition of the spacer material followed by performing an anisotropic etching process on the layer of first spacer material to remove substantially all of the horizontally-oriented portions of the layer of first spacer material.

Figure 16:
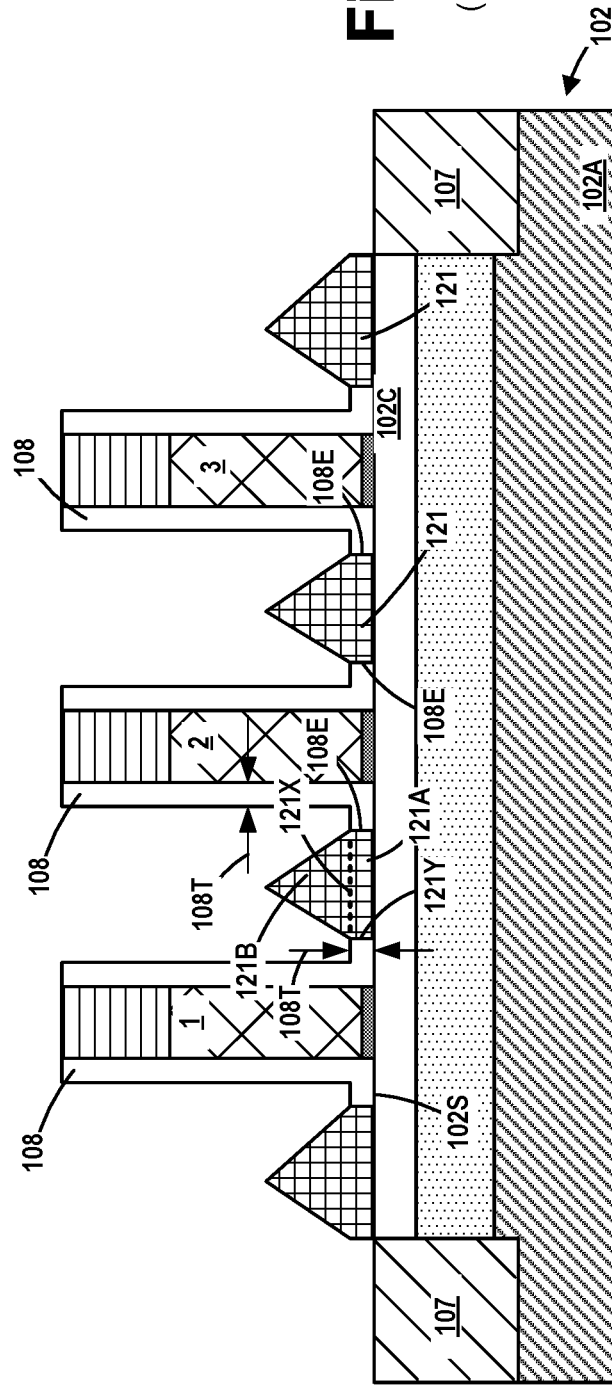
FIG. 16 is a simplistic depiction of a prior art integrated circuit product with epi semiconductor material formed between adjacent opposite facing L-shaped spacers.

The use of the terminology "straight sidewall spacer" used herein and in the claims is intended to distinguish the straight sidewall spacer structures described herein from prior art L-shaped spacers 108, as shown in FIG. 16. FIG. 16 is a depiction of one illustrative process flow wherein an epi semiconductor material 121 was formed on the active layer 102C of the substrate 102 between prior art L-shaped spacers 108. The L-shaped spacers 108 have a nominal thickness 108T and ends 108E. Such L-shaped spacers 108 were typically formed by forming a conformal layer of a first spacer material (e.g., silicon dioxide) on the gate structure, forming a conformal layer of a second spacer material (e.g., silicon nitride) on the conformal layer of the first spacer material, performing an anisotropic etching process on the conformal layer of the second spacer material to form a second sidewall spacer comprised of silicon nitride and, with the second sidewall spacer in position, performing an anisotropic etching process on the conformal layer of first spacer material to produce the L-shaped spacer 108. In the example depicted in FIG. 16, the second sidewall spacer was removed at some point in the process flow after the formation of the L-shaped spacers 108.

The first straight sidewall spacer 109 may be comprised of a variety of different materials, e.g., a low-k material (k value of about 5.5 or less), SiOCN, SiBCN, etc., and it may be formed to any desired thickness 109T, e.g., 5-10 nm based upon current-day technology. It should be noted that the thickness 109T of the first straight sidewall spacer 109 is substantially uniform for at least a distance 109X (e.g., 5-10 nm) above an upper surface 102S of the active layer 102C of the substrate 102. Also note that the first straight sidewall spacer 109 has a substantially vertically oriented outer surface 109S for at least the distance 109X above the upper surface 102S of the active layer 102C of the substrate 102. In the examples depicted herein, the simplistically depicted first straight sidewall spacer 109 has a substantially rectangular shaped cross-sectional configuration when viewed in a cross-section taken through the first straight sidewall spacer 109 in the gate length direction of the transistor devices 101. However, in a real-world IC product 100, the thickness 109T of the first straight sidewall spacer 109 may not be uniform throughout its entire vertical height, e.g., the thickness of the first straight sidewall spacer 109 may decrease (to at least some degree) at locations proximate the upper portion of the gate structure 104 and/or the gate cap 105.

FIG. 2 depicts the IC product 100 after an initial sacrificial layer of material 115, e.g., OPL, SOH, etc., with an initial thickness was formed across the substrate 102. As depicted, an as-formed upper surface 115S of the initial layer of sacrificial material 115 is positioned at a level that is above a level of an upper surface of the gate caps 105. The as-formed upper surface 115S may or may not be substantially planar as depicted in the drawings.

FIG. 3 depicts the IC product 100 after a recess etching process was performed to reduce the initial thickness of the initial sacrificial layer of material 115 to a desired final thickness. This process operation results in the formation of a recessed sacrificial layer of material 115A that has a recessed upper surface 115R. The amount of recessing of the initial sacrificial layer of material 115 may vary depending upon the particular application. In one illustrative example, the recessed sacrificial layer of material 115A may a thickness of about 20-50 nm. As will be appreciated by those skilled in the art after a complete reading of the present application, the amount and extent of the recessing of the initial sacrificial layer of material 115 provides a means to control or tune the thickness and overall volume of the epi material 119 that will be formed in the source/drain regions of the transistors 101, as described more fully below.

FIG. 4 depicts the product 100 after a conformal deposition process was performed to form a conformal layer of second spacer material 111 across the substrate 102, on the first straight sidewall spacers 109 and above the recessed sacrificial layer of material 115A. The conformal layer of second spacer material 111 may be comprised of a variety of different materials, e.g., silicon dioxide, etc., and it may be formed to any desired thickness 111T, e.g., 2-3 nm based upon current-day technology.

FIG. 5 depicts the IC product 100 after an anisotropic etching process was performed to remove horizontally oriented portions of the conformal layer of second spacer material 111. This process operation results in the formation of a second straight sidewall spacer 111S that is positioned against the first straight sidewall spacer 109.

FIG. 6 depicts the IC product 100 after the recessed sacrificial layer of material 115A was removed selectively relative to the surrounding materials. Note that this process operation exposes a bottom surface 111B of the second straight sidewall spacer 111S and at least a portion of the substantially vertically oriented outer surface 109S of the first straight sidewall spacer 109.

FIG. 7 depicts the IC product 100 after an epitaxial growth process was performed to form faceted epi semiconductor material 119 in the source/drain regions of the transistors 101. The faceted epi semiconductor material 119 may comprise any of a variety of semiconductor material, e.g., silicon-germanium, silicon, etc., for PFET transistor devices 101, or silicon-carbon, silicon, etc., for NFET transistor devices 101. The faceted epi semiconductor material 119 may be conceptually separated into a first lower portion 119A and a second faceted portion 119B positioned above the first lower portion 119A. In the examples depicted in the drawings, the first lower portion 119A and the second faceted portion 119B are separated by the dashed line 119X. As depicted, the first lower portion 119A has a generally substantially rectangular shaped cross-sectional configuration when viewed in a cross-section taken through the faceted epi semiconductor material 119 in the gate length direction of the transistor devices 101. Note that the first lower portion 119A has a vertical height 119Y that corresponds approximately to the extent of the vertical height of the outer surface 109S of the first straight sidewall spacer 109 that is exposed by removal of the recessed sacrificial layer of material 115A. Also note that a portion of the first lower portion 119A contacts and engages the bottom surface 111B of the second straight sidewall spacer 111S positioned on laterally adjacent transistor devices. As will be appreciated by those skilled in the art after a complete reading of the present application, the amount of the vertical height of the outer surface 109S of the first straight sidewall spacer 109 against which the lower portion 119A forms may be controlled or tuned by controlling the final thickness of the recessed sacrificial layer of material 115A. The vertical height of the second faceted portion 119B (above the dashed line 119X) as well as the angle of the faceted surfaces may vary depending upon the particular application, as well as the crystallographic orientation of the substrate material. In one illustrative embodiment, the vertical height 119Y of the first lower portion 119A of the faceted epi semiconductor material 119 may range from about 10-15 nm. More specifically, in one illustrative example, a vertical thickness of the substantially rectangular shaped first lower portion 119A of the epi semiconductor material 119 may be approximately equal to a vertical distance between the bottom surface 111B of the second straight sidewall spacer 111S and a bottom surface 109B of the first straight sidewall spacer 109.

As noted above, FIG. 16 is a depiction of a plurality of transistor devices wherein epi semiconductor material 121 was formed on the active layer 102C of the substrate 102 between prior art L-shaped spacers 108 using one illustrative prior art process flow. Using terminology similar to that described above with respect to the faceted epi semiconductor material 119, the prior art faceted epi semiconductor material 121 may be conceptually separated into a first lower portion 121A and a second faceted portion 121B positioned above the first lower portion 121A. In the example depicted in the drawings, the first lower portion 121A and the second faceted portion 121B are separated by the dashed line 121X. As depicted, the first lower portion 121A has a generally substantially rectangular shaped cross-sectional configuration when viewed in a cross-section taken through the prior art faceted epi semiconductor material 121 in the gate length direction of the transistor devices. Note that the first lower portion 121A has a vertical height 121Y that corresponds approximately to the vertical thickness of the end 108E of the L-shaped spacers 108, e.g., the vertical height 121Y corresponds approximately to the thickness 108T.

After a complete reading of the present application, those skilled in the art will appreciated that, using the process flow described herein, the vertical height 119Y of the first lower portion 119A of the epi material 119 is significantly larger than the corresponding vertical height dimension 121Y of the rectangular shaped first lower portion 121A of the prior art epi material 121 that was formed on the active layer 102C of the substrate 102 and abutting the end 108E of the opposite facing L-shaped spacers 108 formed on adjacent transistors. In one illustrative example, the vertical height dimension 121Y of the rectangular shaped first lower portion 121A of the prior art epi material 121 may be about 6-10 nm. As a result, all other things being equal, the volume of the faceted epi semiconductor material 119 formed using the methods disclosed herein may be significantly greater than the volume of the prior art epi material 121 formed between the L-shaped spacers 108 of the prior art. In one illustrative example, all other things being equal, the volume of the faceted epi semiconductor material 119 may be about 10-20% greater than the volume of the prior art epi material 121. The increased volume of the faceted epi semiconductor material 119 disclosed herein may help to reduce contact resistance and thereby increase device performance and/or assist in producing a desired stress condition in the channel region of the transistor. Other advantages may be recognized by those skilled in the art after a complete reading of the present application.

Figure 8:
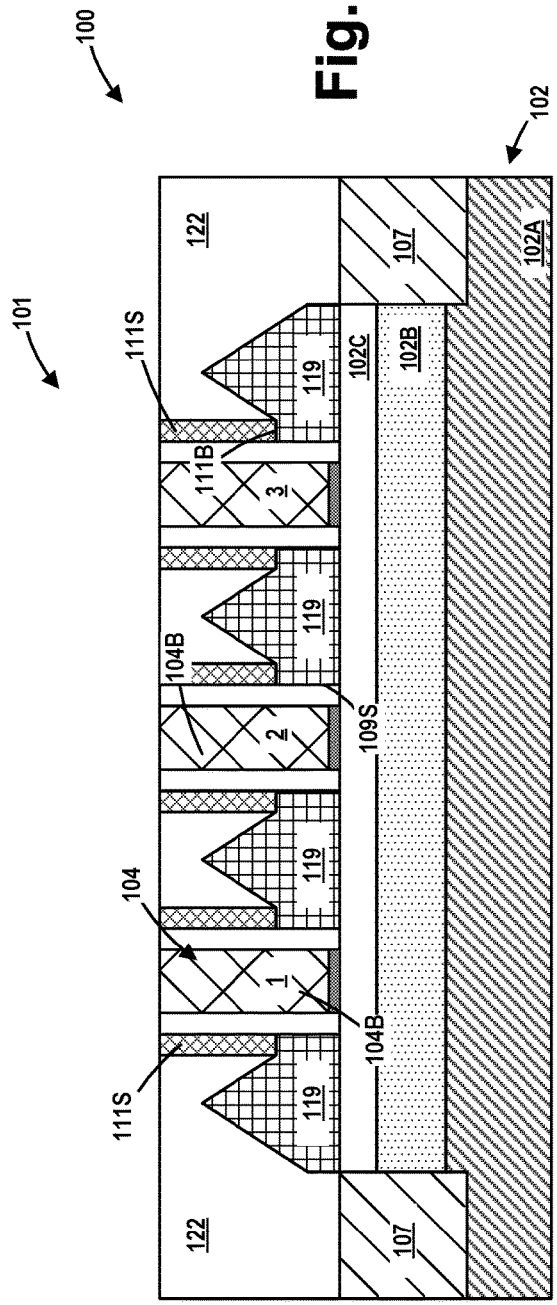

At the point of processing depicted in FIG. 7, traditional manufacturing operations may be performed to complete the IC product 100. Accordingly, FIG. 8 depicts the IC product after several processing operations were performed in accordance with one illustrative process flow. First, at least one layer of insulating material 122 was blanket-deposited across the product. Thereafter, at least one CMP process operation was performed to planarize the upper surface of the insulating material 122 and remove the gate caps 105 so as to expose the upper surface of the conductive gate electrode 104B of the gate structures 104.

Next, with reference to FIG. 9, the insulating material 122 was removed so as to expose the faceted epi semiconductor material 119 in the source/drain regions of the transistor devices 101. At that point, traditional manufacturing techniques were performed to form a metal silicide material 123, e.g., cobalt-silicide, nickel-silicide, etc., on the exposed portions of the faceted epi semiconductor material 119 and on the exposed upper surfaces of the conductive gate electrode 104B of the gate structures 104. At that point, one or more layers of insulating material, e.g., silicon dioxide, was formed on the product. Thereafter, a plurality of simply depicted and representative conductive contact structures 127 were formed to conductively contact the faceted epi semiconductor material 119 in the source/drain regions of the transistor devices 101. In some cases, the conductive contact structures 127 may comprise trench silicide (TS) structures (not shown) and/or other forms of conductive structures.

FIGS. 10-15 depict yet another illustrative novel method disclosed herein for forming enhanced faceted raised source/drain epi material 119 for transistor devices 101 and corresponding integrated circuit products 100. FIG. 10 depicts the product 100 at a point in time after the gate structures 104, gate caps 105 and first straight sidewall spacers 109 were formed on the substrate as previously described. In this process flow, after formation of the first straight sidewall spacers 109, the above-described conformal layer of second spacer material 111 was formed on the product 100 and the first straight sidewall spacers 109.

FIG. 11 depicts the IC product 100 after an anisotropic etching process was performed to remove horizontally oriented portions of the conformal layer of second spacer material 111 and thereby form the above-described second straight sidewall spacer 111S on the first straight sidewall spacer 109.

FIG. 12 depicts the IC product 100 after the above-described recessed sacrificial layer of material 115A was formed on the product 100. As before, the recessed sacrificial layer of material 115A was formed by initially depositing the initial sacrificial layer of material 115 across the product and thereafter performing the above-described recess etching process until such time as the recessed sacrificial layer of material 115A is at its final desired thickness. Note that the recessed layer of sacrificial material 115A covers an outer surface of a first vertical portion of the second straight sidewall spacer 111S while exposing a second vertical portion of the second straight sidewall spacer 111S.

FIG. 13 depicts the IC product 100 after an anisotropic recess etching process was performed to remove second vertical portions of the second straight sidewall spacer 111S, i.e., the portions of the second straight sidewall spacer 111S positioned above the recessed upper surface 115R of the recessed sacrificial layer of material 115A. This process operation results in the formation of a recessed second straight sidewall spacer 111R (which corresponds to the first vertical portion of the second straight sidewall spacer 111S). The recessed second straight sidewall spacer 111R is positioned against the first straight sidewall spacer 109 and it has an upper surface 111P. It should be noted that the thickness 111T of the recessed second straight sidewall spacer 111R is substantially uniform for at least a distance equal to the distance 109X (discussed above with respect to the first straight sidewall spacer 109) above the upper surface 102S of the active layer 102C of the substrate 102. Also note that the recessed second straight sidewall spacer 111R has a substantially vertically oriented outer surface 111X for at least the distance 109X above the upper surface 102S of the active layer 102C of the substrate 102.

Figure 14:
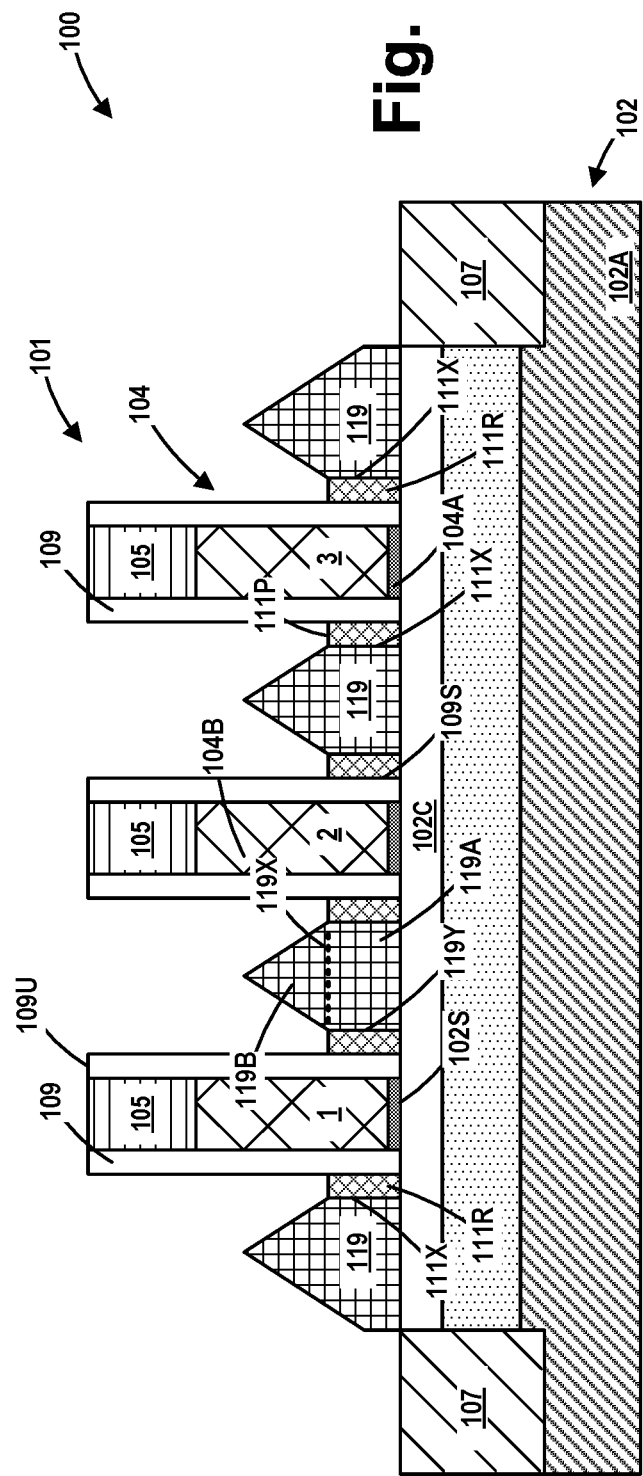

FIG. 14 depicts the IC product 100 after several process operations were performed. First, the recessed sacrificial layer of material 115A was removed selectively relative to the surrounding materials. Note that this process operation exposes the substantially vertically oriented outer surface 111X of the recessed second straight sidewall spacer 111R. Next, an epitaxial growth process was performed to form the above-described faceted epi semiconductor material 119 in the source/drain regions of the transistors 101. All other things being equal, the physical size, e.g., volume of the epi semiconductor material 119 formed using this second process flow, may be less than the volume of faceted epi semiconductor material 119 formed using the previous process flow since, in this second embodiment, the faceted epi semiconductor material 119 is formed in a smaller lateral space above the active layer 102C of the substrate 102, i.e., in the lateral space between recessed second straight sidewall spacers 111R formed for laterally adjacent gate structures. Nevertheless, the epi semiconductor material 119 formed using this second process flow may still be conceptually separated into a first lower portion 119A and a second faceted portion 119B positioned above the first lower portion 119A and have other dimensions consistent with those described above. Moreover, as with the previous example, the epi semiconductor material 119 formed using this second process flow may controlled or tuned by controlling the final thickness of the recessed sacrificial layer of material 115A. In one illustrative embodiment, the vertical height 119Y of the first lower portion 119A of the faceted epi semiconductor material 119 formed using this second process flow may still be in a range from about 10-15 nm. As a result, all other things being equal, the volume of the faceted epi semiconductor material 119 formed using this second process flow disclosed herein may still be significantly greater than the volume of the prior art epi material 121 formed between the L-shaped spacers 108 of the prior art shown in FIG. 16.

With continued reference to FIG. 14, the first straight sidewall spacer 109 comprises a first upper surface 109U positioned at a first level above the upper surface 102S of the active layer 102C of the substrate 102, while the upper surface 111P of the recessed second straight sidewall spacer 111R is positioned at second level (relative to the upper surface 102S of the active layer 102C) that is lower than the first level. Additionally, a vertical height of the substantially rectangular shaped first lower portion 119A of the epi material 119 may be approximately equal to a vertical height of the recessed second straight sidewall spacer 111R.

Figure 15:
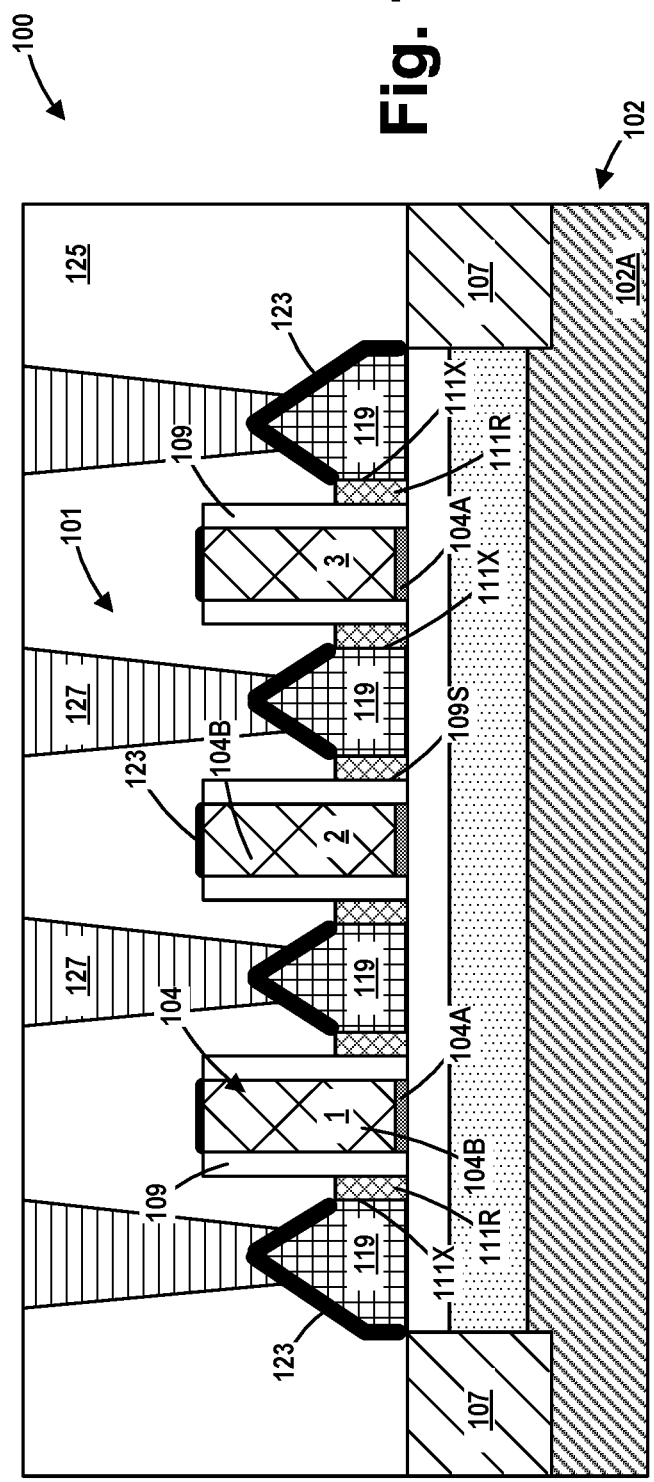

At the point of processing depicted in FIG. 14, traditional manufacturing operations may be performed to complete the IC product 100. Accordingly, FIG. 15 depicts the IC product after the processing operations described above with reference to FIGS. 8 and 9 were performed on the product.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming epi semiconductor material on a transistor that is formed above a semiconductor substrate, said transistor comprising a gate structure and a gate cap positioned above said gate structure, the method comprising:

forming a first straight sidewall spacer adjacent said gate structure, said first straight sidewall spacer comprising an outer surface;

forming a second straight sidewall spacer on said outer surface of said first straight sidewall spacer;

forming a recessed layer of sacrificial material adjacent said second straight sidewall spacer, said recessed layer of sacrificial material having a recessed upper surface, said recessed layer of sacrificial material covering an outer surface of a first vertical portion of said second straight sidewall spacer while exposing a second vertical portion of said second straight sidewall spacer;

removing said second vertical portion of said second straight sidewall spacer;

removing said recessed layer of sacrificial material; and forming an epi semiconductor material on and above said semiconductor substrate, said epi semiconductor material comprising an edge that engages said outer surface of said first vertical portion of said second straight sidewall spacer.

2. The method of claim 1, wherein forming said first straight sidewall spacer comprises forming said first straight sidewall spacer on and in contact with a sidewall of said gate structure.

3. The method of claim 2, wherein forming said first straight sidewall spacer comprises forming said first straight sidewall spacer such that a bottom surface of said first straight sidewall spacer is positioned on and in contact with an upper surface of said semiconductor substrate.

4. The method of claim 1:
wherein forming said first straight sidewall spacer comprises:
depositing a conformal layer of first sidewall spacer material across said semiconductor substrate and on and in contact with a sidewall of said gate structure; and
performing a first anisotropic etching process on said conformal layer of first sidewall spacer material so as to form said first straight sidewall spacer; and
wherein forming said second straight sidewall spacer comprises:
depositing a conformal layer of second sidewall spacer material across said semiconductor substrate and on and in contact with the entire outer surface of said first straight sidewall spacer; and
performing a second anisotropic etching process on said conformal layer of second sidewall spacer material so as to form said second straight sidewall spacer.

5. The method of claim 1, wherein forming said recessed layer of sacrificial material comprises:
forming an initial layer of said sacrificial material with an initial thickness, wherein an as-formed upper surface of said initial layer of said sacrificial material is positioned at a level that is above a level of an upper surface of said gate cap;
performing a recess etching process on said initial layer of said sacrificial material to reduce said initial thickness to a final thickness and thereby form said recessed layer of sacrificial material.

6. The method of claim 1, wherein said first straight sidewall spacer comprises a low-k insulating material, said second straight sidewall spacer comprises silicon dioxide and wherein said transistor is one of a PFET or an NFET planar transistor device.

7. The method of claim 1, wherein forming said epi semiconductor material comprises forming said epi semiconductor material such that it comprises a substantially rectangular shaped first lower portion and a faceted second portion positioned above said first lower portion, wherein an edge of said substantially rectangular shaped first lower portion contacts and engages said outer surface of said first vertical portion of said second straight sidewall spacer.

8. The method of claim 7, wherein forming said epi semiconductor material comprises forming said epi semiconductor material such that a vertical height of said substantially rectangular shaped first lower portion is approximately equal to a vertical height of said first vertical portion of said second straight sidewall spacer.

9. The method of claim 1, wherein forming said epi semiconductor material comprises forming said epi semiconductor material such that a bottom surface of said epi semiconductor material is formed on an upper surface of said semiconductor substrate.

10. A method of forming epi semiconductor material on a transistor that is formed above a semiconductor substrate, said transistor comprising a gate structure and a gate cap positioned above said gate structure, the method comprising:
depositing a conformal layer of first sidewall spacer material across said semiconductor substrate and on and in contact with a sidewall of said gate structure;
performing a first anisotropic etching process on said conformal layer of first sidewall spacer material so as to form a first straight sidewall spacer positioned on and in contact with said sidewall of said gate structure, said first straight sidewall spacer comprising an outer surface;
depositing a conformal layer of second sidewall spacer material across said semiconductor substrate and on and in contact with the entire outer surface of said first straight sidewall spacer;
performing a second anisotropic etching process on said conformal layer of second sidewall spacer material so as to form a second straight sidewall spacer on and in contact with said first straight sidewall spacer;
forming a recessed layer of sacrificial material adjacent said second straight sidewall spacer, said recessed layer of sacrificial material having a recessed upper surface, said recessed layer of sacrificial material covering an outer surface of a first vertical portion of said second straight sidewall spacer while exposing a second vertical portion of said second straight sidewall spacer;
removing said second vertical portion of said second straight sidewall spacer;
removing said recessed layer of sacrificial material; and
forming an epi semiconductor material on and above said semiconductor substrate, said epi semiconductor material comprising an edge that engages said outer surface of said first vertical portion of said second straight sidewall spacer.

11. The method of claim 10, wherein forming said recessed layer of sacrificial material comprises:
forming an initial layer of said sacrificial material with an initial thickness, wherein an as-formed upper surface of said initial layer of sacrificial material is positioned at a level that is above a level of an upper surface of said gate cap; and
performing a recess etching process on said initial layer of sacrificial material to reduce said initial thickness to a final thickness and thereby form said recessed layer of sacrificial material.

12. A transistor, comprising;
a gate structure positioned above a semiconductor substrate, said semiconductor substrate comprising an upper surface;
a gate cap positioned above said gate structure;
a first straight sidewall spacer positioned on and in contact with a sidewall of said gate structure, said first straight sidewall spacer comprising an outer surface and a first upper surface positioned at a first level above said upper surface of said semiconductor substrate;
a second straight sidewall spacer positioned on and in contact with said first straight sidewall spacer, said second straight sidewall spacer comprising a second upper surface positioned at a second level above said upper surface of said semiconductor substrate, wherein said second level is lower than said first level, and wherein said second straight sidewall spacer comprises an outer surface; and
an epi semiconductor material positioned on and above said semiconductor substrate, said epi semiconductor material comprising:

a substantially rectangular shaped first lower portion that comprises an edge that engages said outer surface of said second straight sidewall spacer, wherein a vertical height of said substantially rectangular shaped first lower portion is approximately equal to a vertical height of said second straight sidewall spacer; and
a faceted second portion positioned above said first lower portion.

13. The transistor of claim 12, wherein said first straight sidewall spacer comprises a low-k insulating material, said second straight sidewall spacer comprises silicon dioxide and wherein said transistor is one of a PFET or an NFET planar transistor device.

14. The transistor of claim 12, wherein said vertical thickness of said substantially rectangular shaped first lower portion of said epi semiconductor material is about 10-15 nm.

15. The transistor of claim 12, wherein said first straight sidewall spacer comprises a bottom surface and wherein said bottom surface of said first straight sidewall spacer is positioned on and in contact with said upper surface of said semiconductor substrate.

16. The transistor of claim 15, wherein a bottom surface of said epi semiconductor material is positioned on and in contact with said upper surface of said semiconductor substrate.

17. The transistor of claim 12, wherein said first straight sidewall spacer has a substantially uniform thickness in a gate length direction of the transistor for at least a distance of 5 nm above the upper surface of the semiconductor substrate.

18. The transistor of claim 12, wherein said first straight sidewall spacer and said second straight sidewall spacer have a non L-shaped configuration when viewed in a cross-section taken through the first straight sidewall spacer and said second straight sidewall spacer in a direction that corresponds to a gate length direction of the transistor.

* * * * *